(12) United States Patent
Takubo

(10) Patent No.: US 11,410,741 B2
(45) Date of Patent: Aug. 9, 2022

(54) MEMORY CONTROLLER AND FLASH MEMORY SYSTEM

(71) Applicant: TDK CORPORATION, Tokyo (JP)

(72) Inventor: Kenichi Takubo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/161,878

(22) Filed: Jan. 29, 2021

(65) Prior Publication Data

US 2021/0249098 A1 Aug. 12, 2021

(30) Foreign Application Priority Data

Feb. 7, 2020 (JP) .............................. JP2020-019673

(51) Int. Cl.
*G11C 29/24* (2006.01)
*G11C 29/42* (2006.01)
*G11C 29/44* (2006.01)

(52) U.S. Cl.
CPC .............. *G11C 29/42* (2013.01); *G11C 29/24* (2013.01); *G11C 29/44* (2013.01)

(58) Field of Classification Search
CPC .......... G11C 29/42; G11C 29/24; G11C 29/44
USPC .................................................. 365/185.09
See application file for complete search history.

(56) References Cited

U.S. PATENT DOCUMENTS

| | | | | |
|---|---|---|---|---|
| 6,388,919 | B2 * | 5/2002 | Terasaki ............... | G11C 16/344 365/185.09 |
| 8,190,835 | B1 * | 5/2012 | Yueh ....................... | G06F 12/00 711/170 |
| 2012/0278569 | A1 * | 11/2012 | Kawakami ............ | G06F 3/0641 711/E12.103 |
| 2015/0169240 | A1 * | 6/2015 | Saito ..................... | G06F 3/0689 711/162 |
| 2021/0173776 | A1 * | 6/2021 | Li ........................ | G06F 12/1009 |
| 2021/0248034 | A1 * | 8/2021 | Takubo ............... | G06F 11/3037 |

FOREIGN PATENT DOCUMENTS

JP 2006-018373 A 1/2006

* cited by examiner

*Primary Examiner* — Ly D Pham
(74) *Attorney, Agent, or Firm* — Oliff PLC

(57) ABSTRACT

A memory controller includes a control circuit. The control circuit configures a plurality of physical blocks in a flash memory into a group. The control circuit allocates the plurality of physical blocks constituting the group to a data block and a redundant block. The control circuit writes data required to be saved into the data block. The control circuit writes redundant data based on the data required to be saved into the redundant block belonging to the same group as the data block. When all the data required to be saved are successfully written into the data block, the control circuit releases from the group at least one redundant block belonging to the same group as the data block.

6 Claims, 18 Drawing Sheets

*FIG. 8*

| DATA BLOCK 1 | DATA BLOCK 2 | DATA BLOCK 3 | REDUNDANT BLOCK |
|---|---|---|---|
| BLOCK a | BLOCK b | BLOCK f | BLOCK d |
| BLOCK h | BLOCK p | BLOCK m | BLOCK c |

······

| DATA BLOCK 1 | REDUNDANT BLOCK 1 | REDUNDANT BLOCK 2 |
|---|---|---|
| BLOCK a | BLOCK b | BLOCK f |

| DATA BLOCK 1 | REDUNDANT BLOCK 1 | REDUNDANT BLOCK 2 |
|---|---|---|
| BLOCK b | NOTHING ALLOCATED | BLOCK f |

MEMORY CONTROLLER AND FLASH MEMORY SYSTEM

CROSS-REFERENCE TO RELATED APPLICATION

This application claims the benefit of Japanese Patent Application No. 2020-019673, filed on Feb. 7, 2020, the entire disclosure of which is incorporated by reference herein.

FIELD

This application relates generally to a memory controller and a flash memory system.

BACKGROUND

There are some cases where, when data are written into a flash memory, the data are not successfully written and data including an error are written. There is also a case where, although data were successfully written at the time of data writing, an error occurs in the written data caused by subsequent data reading, lapse of time, or the like. In particular, when data are written into a cell to which a large number of times of data reading, data writing and data erasure have been performed, a tunnel oxide film of the cell has been deteriorated and such problems are thus likely to occur.

In order to cope with the above-described problem, writing an error-correcting code (ECC) for correcting an error in conjunction with data at the time of data writing has generally been performed. However, there are some cases where an error exceeding error correction capability of such an error-correcting code occurs in data.

In Unexamined Japanese Patent Application Publication No. 2006-18373, a technology of writing parity data generated based on user data written into a plurality of blocks into a parity block and, when there are user data that cannot be corrected using an error-correcting code, reading parity data from the parity block and thereby performing error correction is disclosed.

SUMMARY

In order to achieve the above-described objective, a memory controller according to a first aspect of the present disclosure includes circuitry, in which
the circuitry
configures a plurality of physical blocks in a flash memory into a group, allocates the plurality of physical blocks constituting the group to a data block and a redundant block,
writes data required to be saved into the data block, and writes redundant data based on the data required to be saved into the redundant block belonging to the same group as the data block, and
when all the data required to be saved are successfully written into the data block, releases from the group at least one redundant block belonging to the same group as the data block.

The memory controller may be a memory controller in which
the circuitry further
when there is an error block, the error block being a data block into which the data required to be saved are not successfully written, recovers data required to be successfully written into the error block, based on data successfully written into the plurality of physical blocks constituting a group to which the error block belongs,
releases the error block from the group to which the error block belongs,
adds a new physical block to the group,
allocates the new physical block to the data block, and writes recovered data into the new physical block.

The memory controller may be a memory controller in which
the circuitry allocates two or more physical blocks to the data block,
the redundant data is parity data generated by calculating parity across pieces of data each of which is written into one of the two or more physical blocks allocated to the data block, and
the circuitry recovers data required to be successfully written into the error block, based on data successfully written into the data block and parity data successfully written into the redundant block.

The memory controller may be a memory controller in which
the redundant data are the same data as data to be written into the data block, and
when there is an error block, the error block being a data block into which the data required to be saved are not successfully written, the circuitry further releases the error block from a group to which the data block belongs and allocates the redundant block into which the same redundant data as data required to be successfully written into the error block are written to the data block.

The memory controller may be a memory controller further including
a storage storing a group management table for managing the group, in which
the circuitry further
writes information indicating a correspondence relationship between the group and the plurality of physical blocks and information indicating an allocation of the data block and an allocation of the redundant block into the group management table, and
referring to the group management table, identifies the data block and the redundant block targeted for data writing.

In order to achieve the above-described objective, a flash memory system according to a second aspect of the present disclosure includes the memory controller and the flash memory.

BRIEF DESCRIPTION OF THE DRAWINGS

A more complete understanding of this application can be obtained when the following detailed description is considered in conjunction with the following drawings, in which:

FIG. 8 is a diagram illustrating an example of a group management table according to Embodiment 1 of the present disclosure;

DETAILED DESCRIPTION

Figure 1:
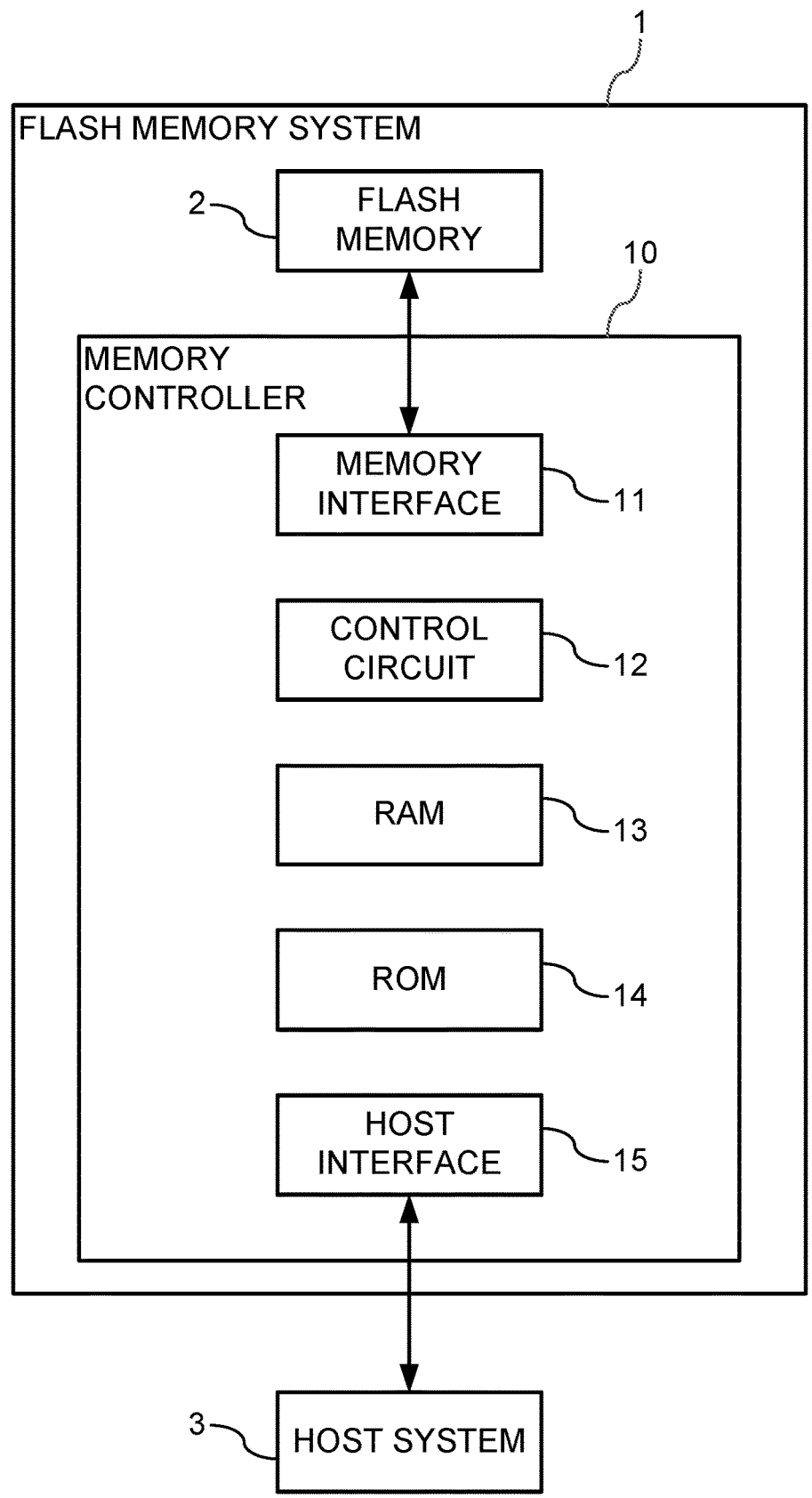
FIG. 1 is a block diagram illustrating a configuration of a flash memory system according to an embodiment of the present disclosure.

Hereinafter, referring to the drawings, a memory controller and a flash memory system according to embodiments of the present disclosure will be described. The same reference signs are assigned to the same or equivalent constituent components in the respective drawings.

Embodiment 1

Referring to FIG. 1, a flash memory system 1 according to Embodiment 1 will be described.

The flash memory system 1 includes a flash memory 2 and a memory controller 10. The flash memory system 1 is connected to a host system 3. The flash memory system 1 is, for example, a solid state drive (SSD) or an embedded multi media card (eMMC). The flash memory system 1 is used as a secondary storage device of the host system 3. The flash memory system 1 is an example of the flash memory system according to the present disclosure.

The flash memory 2 includes one or more flash memory chips. The flash memory 2 is a NAND-type flash memory in Embodiment 1. The NAND-type flash memory 2 reads and writes data in units of a page and erases data in units of a block, which is made up of a plurality of pages. The flash memory 2 is an example of the flash memory according to the present disclosure.

Figure 2:
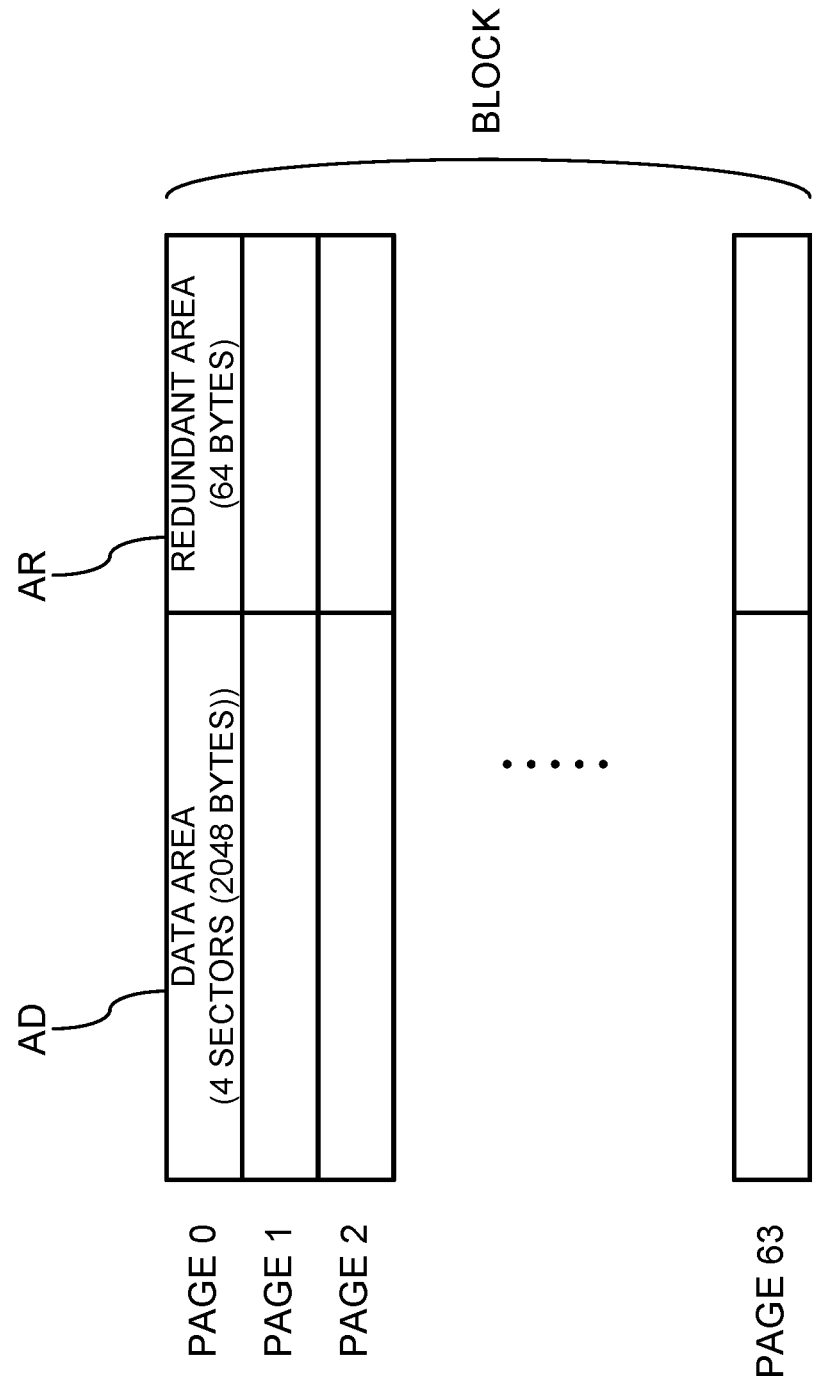
FIG. 2 is a diagram illustrating an example of a block configuration of a flash memory according to the embodiment of the present disclosure.

Referring to FIG. 2, an example of a block configuration of the flash memory 2 will be described. In FIG. 2, a block is made up of 64 pages. A page is made up of a data area AD of 4 sectors (2048 bytes) and a redundant area AR of 64 bytes. Data are written into the data area AD, and information relating to management of the page is written into the redundant area AR. In particular, an error-correcting code for correcting an error occurring in data that are written into the data area AD is written into the redundant area AR. The error-correcting code is, for example, a Reed-Solomon code or a low-density parity-check (LDPC) code. An error occurring in the flash memory 2 is, however, highly likely to occur at the time of data writing, and it is anticipated that errors occur to the extent that the errors cannot be corrected even using the error-correcting code. Note that there is a case where, in the storage area of each page, data areas AD of one sector (512 bytes) and redundant areas AR of 16 bytes are alternately allocated in a sequence of a data area AD, a redundant area AR, a data area AD, a redundant area AR, and so on.

Note that, in general, a page and a block of a flash memory are also referred to as a physical page and a physical block, respectively. This is to discriminate the physical page and the physical block from a logical page and a logical block that are units in which the host system processes data. Note, however, that, in the following description, a physical page and a physical block are sometimes referred to as a page and a block, respectively, in the operation of writing, reading, or erasure of data into or from a physical page and a physical block of the flash memory 2.

FIG. 1 is referred to again. The memory controller 10 communicates with the host system 3 and controls the flash memory 2. The memory controller 10 writes data received from the host system 3 into the flash memory 2 when receiving a write request from the host system 3 and reads data from the flash memory 2 and transmits the data to the host system 3 when receiving a read request from the host system 3. The memory controller 10 enables high error correction capability to be achieved with high capacity efficiency, which will be described in detail later. Details of the configuration of the memory controller 10 will be described later. The memory controller 10 is an example of the memory controller according to the present disclosure.

The host system 3 is a host system that uses the flash memory system 1 as a secondary storage device. The host system 3 is, for example, a personal computer or a smartphone.

Figure 3:
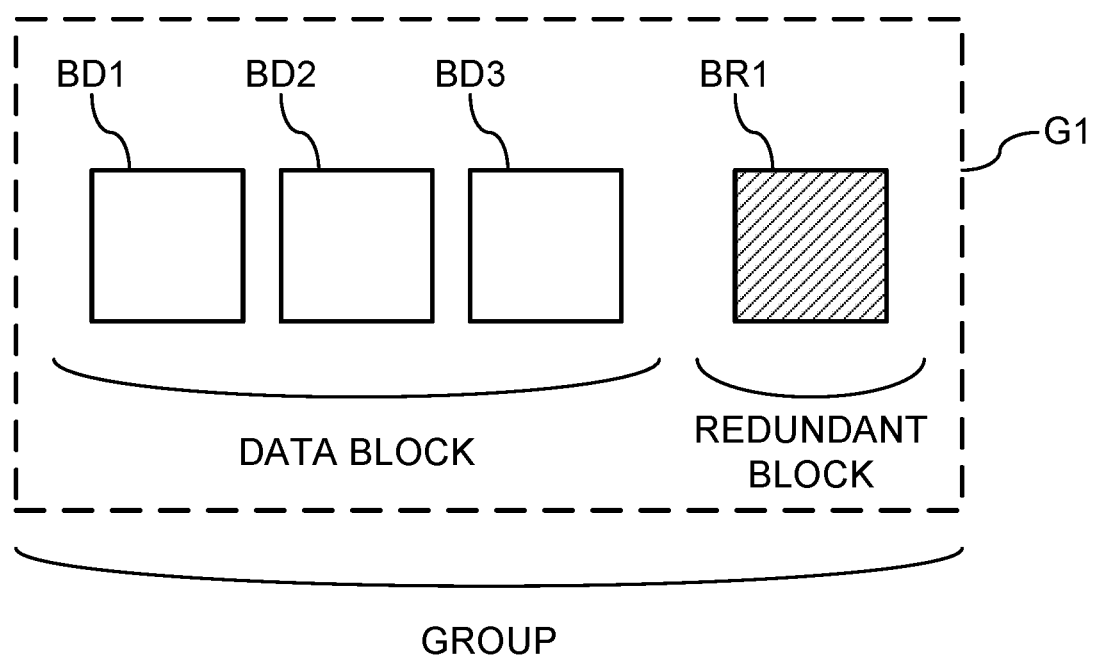
FIG. 3 is a diagram illustrating an example of a group configured by a memory controller according to Embodiment 1 of the present disclosure.
Figure 4:
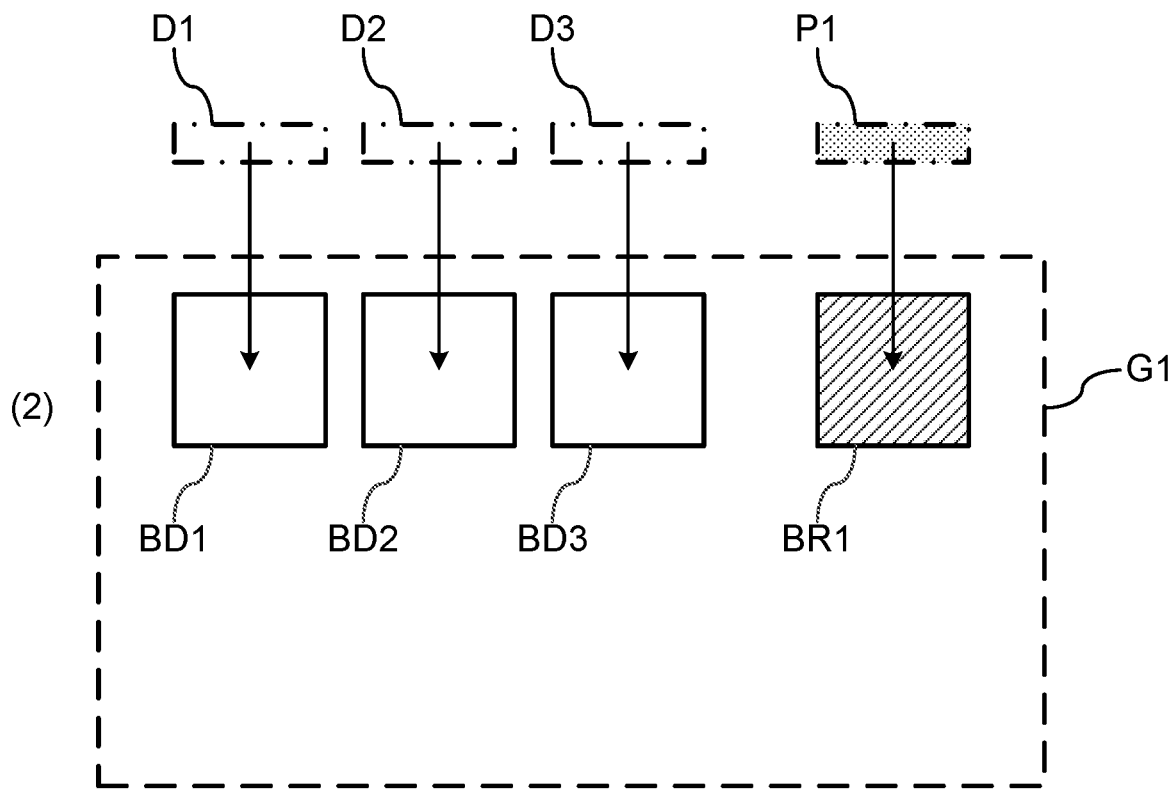
FIG. 4 is a diagram illustrating an outline of data writing performed by the memory controller according to Embodiment 1 of the present disclosure.
Figure 5:
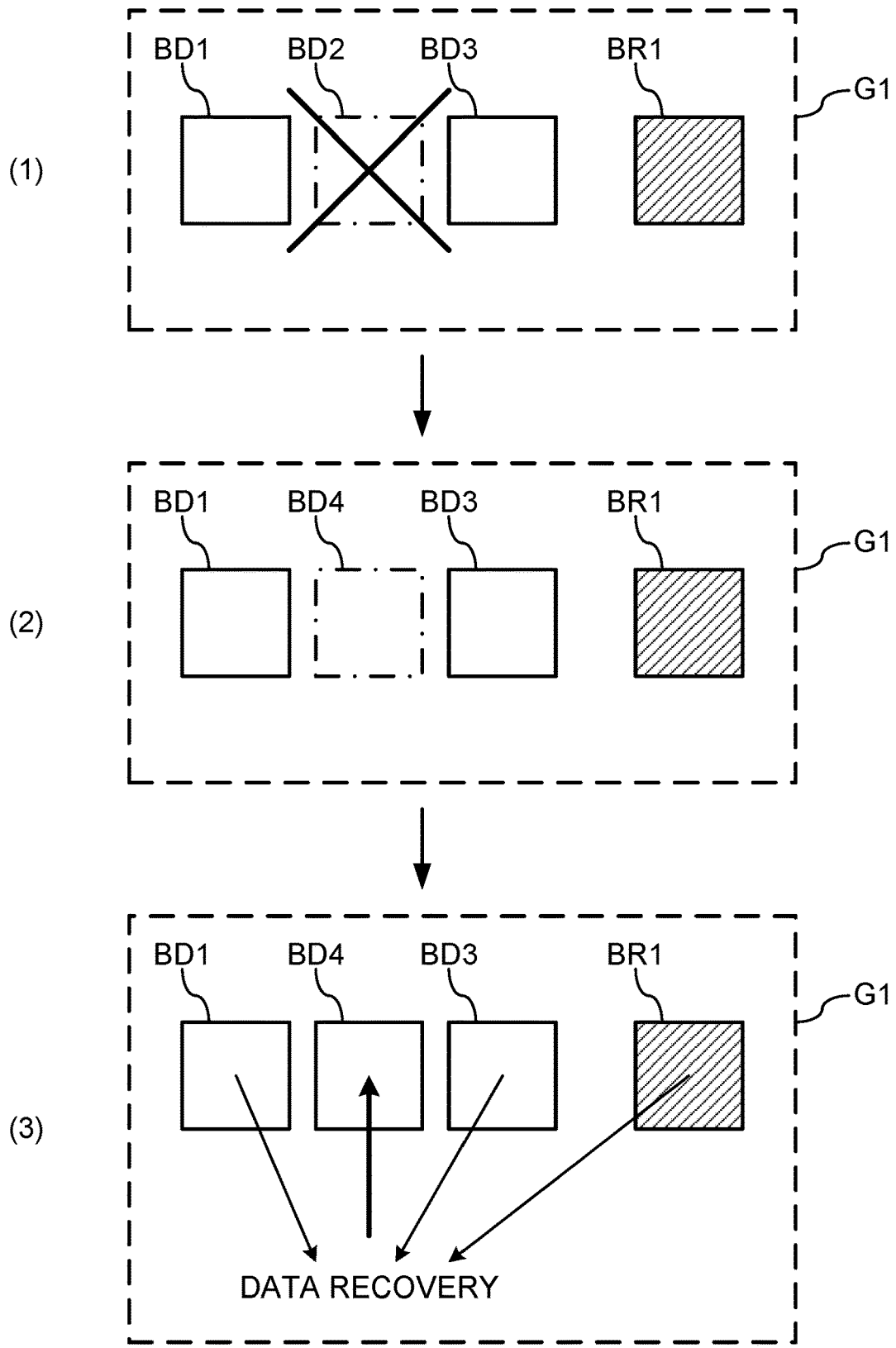
FIG. 5 is a diagram illustrating an outline of data recovery performed by the memory controller according to Embodiment 1 of the present disclosure.

Next, to facilitate understanding, a flash memory control method performed by the memory controller 10 will be schematically described using a specific example with reference to FIGS. 3 to 5.

First, as illustrated in FIG. 3, the memory controller 10 configures a plurality of blocks in the flash memory 2 into a group. In FIG. 3, a group G1 is made up of four blocks. The memory controller 10 allocates a plurality of blocks constituting a group to data blocks and a redundant block. The data block is a block into which data required to be saved are written. The redundant block is a block into which redundant data for correcting an error occurring in a data block are written. In FIG. 3, three blocks among the respective blocks in the group G1 are allocated to data blocks BD1, BD2, and BD3, and the other block is allocated to a redundant block BR1. In Embodiment 1, a case where, as illustrated in FIG. 3, three data blocks and a redundant block are allocated in a group will be described.

Next, referring to FIG. 4, an outline of data writing performed by the memory controller 10 will be described. First, as illustrated in section (1) of FIG. 4, the memory controller 10 prepares data D1, D2 and D3, which are data required to be saved, in units of a page and generates parity data P1 in units of a page. The data required to be saved are basically data for which a write request is issued by the host system 3 and, in addition thereto, may be data required to be saved due to the convenience of management of the flash memory 2. The data D1, D2, and D3 are data of a page unit that are written into the data blocks BD1, BD2, and BD3, respectively, and the parity data P1 are data of a page unit that are written into the redundant block BR1. The memory controller 10 calculates parity, based on the data D1, D2, and D3 and thereby generates the parity data P1. The parity calculated based on three pages of data, namely the data D1, D2, and D3, is, for example, horizontal parity generated by calculating exclusive ORs (XORs) of the bit string of the data D1, the bit string of the data D2, and the bit string of the data D3. In other words, the parity is generated by calculating exclusive ORs across pieces of data each of which is written into a page in one of the data blocks BD1, BD2, and BD3.

Next, as illustrated in section (2) of FIG. 4, the memory controller 10 writes the data D1, D2, and D3, which are data of a page unit, into pages in the data blocks BD1, BD2, and BD3, respectively, and writes the parity data P1, which are calculated based on the three pages of data, into a page in the redundant block BR1. On this occasion, into a page of each of the blocks, an error-correcting code corresponding to data written into the page is also written. The data D1, D2, and D3 and the parity data P1, which is calculated based on the data, are written into pages with the same number in the data blocks BD1, BD2, and BD3 and the redundant block BR1, respectively. In other words, the parity data based on three pages of data that are respectively written into pages 1 in the data blocks BD1, BD2, and BD3, are written into page 1 in the redundant block BR1. Similarly, the parity data based on three pages of data that are respectively written into page 2 in the three data blocks are written into page 2 in the redundant block BR1, and, in subsequent pages, data and parity data are written in a similar combination.

Subsequently, the memory controller 10 determines whether or not data are successfully written into each of the data blocks BD1, BD2, and BD3. Specifically, the memory controller 10 first reads data and a corresponding error-correcting code written into each page in each data block. The memory controller 10, with respect to each data block, determines that data are successfully written into the data block when there is no error with respect to all pages in the data block or, although there is an error in data in a page, the error is correctable using a corresponding error-correcting code. On the other hand, the memory controller 10 determines that data are not successfully written into the data block when there is an error in data with respect to at least a page and the error is uncorrectable even using a corresponding error-correcting code (that is, there have occurred an error exceeding error correction capability of a corresponding error-correcting code).

Referring to FIG. 5, an outline of operation of the memory controller 10 in the case where data are not successfully written into one of the data blocks will be described. In FIG. 5, data are not successfully written into the data block BD2, and data are successfully written into the data blocks BD1 and BD3 and the redundant block BR1. A data block into which data are not successfully written is hereinafter referred to as an error block. First, as illustrated in section (1) of FIG. 5, the memory controller 10 releases the data block BD2, which is an error block, from the group G1.

Next, as illustrated in section (2) of FIG. 5, the memory controller 10 adds a new block to the group G1 and allocates the added block to a data block (the block is referred to as a data block BD4).

Next, as illustrated in section (3) of FIG. 5, the memory controller 10 reads data from the data blocks BD1 and BD3, into which data are successfully written, and the redundant block BR1 and recovers data required to be originally written into the data block BD2, which is an error block. Specifically, when the parity data written into the redundant block BR1 are horizontal parity, a page of data required to be originally written into the data block BD2, which is an error block, can be recovered by calculating exclusive ORs of three pages of data respectively read from the data blocks BD1 and BD3 and the redundant block BR1. In other words, even when an error exceeding the error correction capability of an error-correcting code occurs at the time of data writing into the data block BD2, it is possible to correct the error, using the redundant block BR1.

The memory controller 10 writes the recovered data into the new data block BD4 in units of a page. With regard to successfully written data among the data written into the respective pages in the data block BD2, the memory controller 10 writes the original data into the new data block BD4 in units of a page. The memory controller 10 determines whether or not data are successfully written into the data block BD4. When the data are also not successfully written into the data block BD4, the memory controller 10 repeats the operation illustrated in FIG. 5 again. When the data are successfully written into the data block BD4, the memory controller 10 performs an operation illustrated in FIG. 6, which will be described below.

Figure 6:
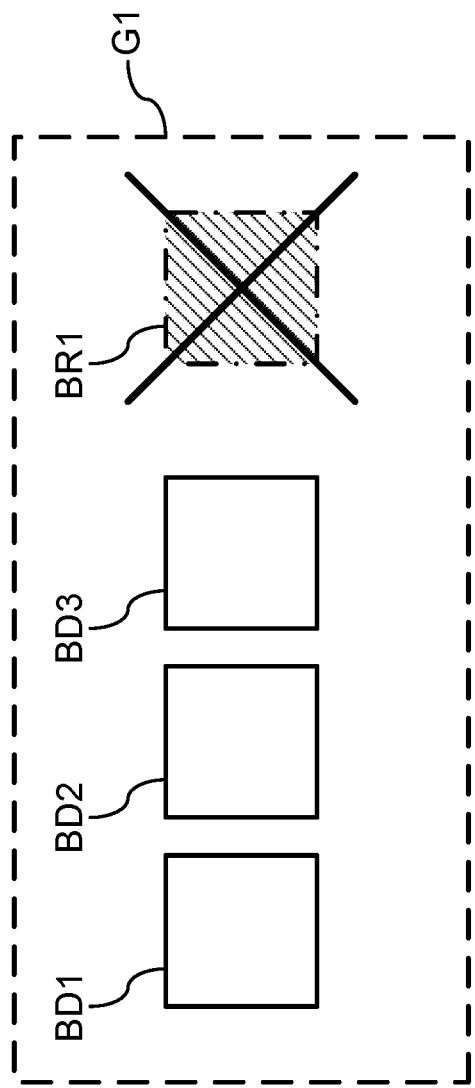
FIG. 6 is a diagram illustrating an outline of redundant block release performed by the memory controller according to Embodiment 1 of the present disclosure.

Referring to FIG. 6, an outline of the operation of the memory controller 10 in the case where data are successfully written into all the data blocks will be described. On this occasion, as illustrated in FIG. 6, the memory controller 10 releases the redundant block BR1 from the group G1. The redundant block BR1 released from the group G1 becomes a free block that is not used for data saving.

The flash memory control method performed by the memory controller 10 has been schematically described above. Since the memory controller 10 enables an error to be corrected using a redundant block even when an error occurring at the time of writing data required to be saved exceeds the error correction capability of an error-correcting code, it is possible to achieve high error correction capability. Since, when all the data required to be saved are successfully written, the memory controller 10 releases the redundant block from the group, it is possible to reserve a free space of the flash memory 2 and achieve high capacity efficiency.

Note that the numbers of data blocks and redundant blocks per group are determined taking into consideration balance between recovery capability of data and capacity efficiency. For example, when the number of redundant blocks is one, the larger the number of data blocks per group is, the higher the capacity efficiency becomes. However, since the larger the number of data blocks per group is, the higher an occurrence rate of an error block per group becomes, the recovery capability of data becomes low. This is because, when a larger number of error blocks than the number of redundant blocks occur, it becomes impossible to recover data. Note that, since the recovery of data is performed in units of a page, it is possible to recover data unless the number of pages into which data are not successfully written among pages combined with one another is greater than the number of redundant blocks.

Referring to FIG. 1 again, the configuration of the memory controller 10 will be described. The memory controller 10 includes a memory interface 11, a control circuit 12, a RAM 13, a ROM 14, and a host interface 15.

The memory interface 11 is an interface for communicating with the flash memory 2. The memory interface 11 is a memory interface conforming to, for example, the open NAND flash interface (ONFI) standard.

The control circuit 12 transmits and receives data to and from the host system 3 via the host interface 15 and controls the flash memory 2 via the memory interface 11. The control circuit 12 includes a central processing unit (CPU) and peripheral circuits. The CPU reading and executing control programs stored in the ROM 14 causes functions of respective functional units, which will be described later, to be achieved. The control circuit 12 is an example of circuitry according to the present disclosure.

The RAM 13 temporarily stores work data necessary for the CPU to execute the afore-described control programs, data received from the host system 3, data read from the flash memory 2, and the like. In other words, the RAM 13 functions as a buffer memory. The RAM 13, in particular, stores a group management table, which will be described later. The RAM 13 is, for example, a volatile memory that is accessible at high speed, such as a static random access memory (SRAM) and a dynamic random access memory (DRAM). The RAM 13 is an example of a storage according to the present disclosure.

The ROM 14 stores the afore-described control programs. The ROM 14 is, for example, a programmable read-only memory (PROM) or an electrically erasable programmable read-only memory (EEPROM).

The host interface 15 is an interface for communicating with the host system 3. The host interface 15 is, for example, an interface conforming to the serial advanced technology attachment (SATA) standard or an interface conforming to the non-volatile memory express (NVMe) standard.

Figure 7:
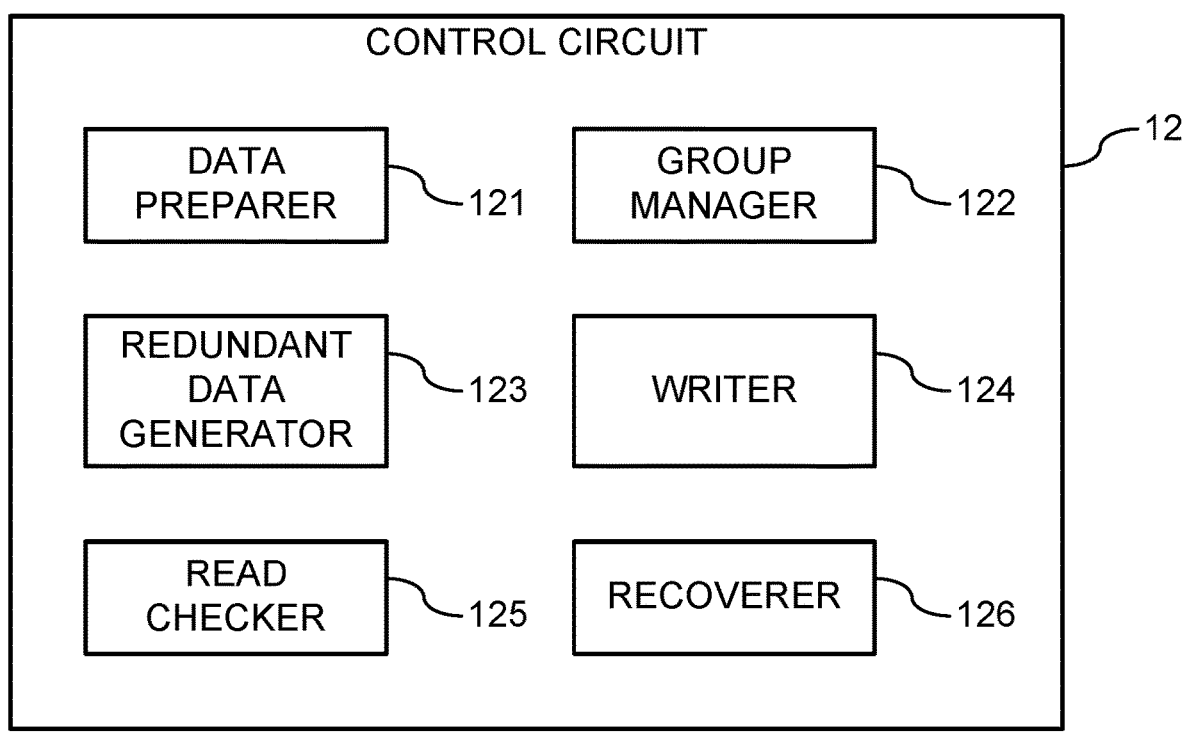
FIG. 7 is a block diagram illustrating a functional configuration of a control circuit of the memory controller according to Embodiment 1 of the present disclosure.

Referring to FIG. 7, respective functional units in the control circuit 12, which are achieved by the CPU of the control circuit 12 reading and executing control programs stored in the ROM 14, will be described. The control circuit 12 includes, as functional constituent components, a data preparer 121, a group manager 122, a redundant data generator 123, a writer 124, a read checker 125, and a recoverer 126.

The data preparer 121 prepares data required to be saved in respective blocks in units of a page, as illustrated in the afore-described FIG. 4. Data of a page unit are successively written into respective pages in a block by the writer 124, which will be described later. For example, the data preparer 121, by partitioning data for which a write request has been issued by the host system 3 (data received from the host system 3) in units of a page and storing the partitioned data in the RAM 13, prepares data required to be saved in units of a page. In addition to the above, when, although not data from the host system 3, data required to be newly written into the flash memory 2 due to the convenience of management emerge, the data preparer 121 prepares the data in units of a page.

The group manager 122 configures a plurality of blocks in the flash memory 2 into a group and allocates the plurality of blocks constituting the group to data blocks and a redundant block. Specifically, as illustrated in the afore-described FIG. 3, the group manager 122 configures four blocks in the flash memory 2 into a group and allocates the four blocks constituting the group to three data blocks and a redundant block. When the group manager 122 has successfully written data into all the data blocks in the group, the group manager 122 releases the redundant block belonging to the group from the group, as illustrated in the afore-described FIG. 6. When there is an error block among the data blocks in the group, the group manager 122 releases the error block from the group, adds a new block to the group, and allocates the added block to the data block, as illustrated in the afore-described FIG. 5.

The group manager 122 writes information indicating a correspondence relationship between a group and blocks and information indicating an allocation of data blocks and a redundant block into the group management table stored in the RAM 13. The group management table is, for example, a table illustrated in FIG. 8. Each row in the table illustrated in FIG. 8 indicates a group. For example, the group management table illustrated in FIG. 8 indicates that blocks a, b, f, and d constitute a group and also indicates that the blocks a, b, and f are allocated to data blocks and the block d is allocated to a redundant block. The group manager 122, by writing information into the group management table in this form, writes information indicating a correspondence relationship between a group and blocks and information indicating an allocation of data blocks and a redundant block into the group management table.

The redundant data generator 123 calculates parity across pieces of data each of which is written into a page in one of the data blocks and thereby generates parity data that are redundant data, as illustrated in the afore-described FIG. 4. As described afore, the redundant data generator 123, for example, sets as parity data horizontal parity that is obtained by calculating exclusive ORs of pieces of data each of which is written into a page in one of the data blocks. Since data written into pages in the respective data blocks are data required to be saved that the data preparer 121 has prepared in units of a page, it can be said that the redundant data generator 123 generates parity data (redundant data) of a page unit, based on pieces of data of a page unit required to be saved.

The writer 124 writes pieces of data that the data preparer 121 has prepared in units of a page into pages in the respective data blocks belonging to the same group and writes parity data that the redundant data generator 123 has generated into a page in the redundant block belonging to the above-described group, as illustrated in the afore-described FIG. 4. The writer 124 also writes data that the recoverer 126, which will be described later, has recovered into a page in a data block that the group manager 122 has newly allocated to the above-described group, as illustrated in the afore-described FIG. 5. In addition, the writer 124, referring to the group management table stored in the RAM 13, identifies data blocks and a redundant block that are targets of writing of the data.

The read checker 125 determines whether or not data are successfully written with respect to blocks into which data have been written by the writer 124. Specifically, the read checker 125 first reads data and a corresponding error-correcting code from each block in units of a page. The read checker 125 determines that data are successfully written into the block when there is no error in data with respect to all pages or, although there is an error in data, the error is correctable using a corresponding error-correcting code and determines that data are not successfully written into the block when there is an error in data and the error is uncorrectable even using a corresponding error-correcting code. Hereinafter, the read checker 125 reading data from a block and determining whether or not data are successfully written is referred to as "to read-check".

The recoverer 126 recovers data required to be successfully written into an error block in units of a page, based on data that have successfully been written into the other data blocks belonging to the same group as the error block and parity data that have been written into the redundant block belonging to the group, as illustrated in the afore-described FIG. 5. In other words, it can be said that the recoverer 126 recovers data required to be successfully written into an error block in units of a page, based on data that have successfully been written into a plurality of blocks constituting the group to which the error block belongs.

Figure 9:
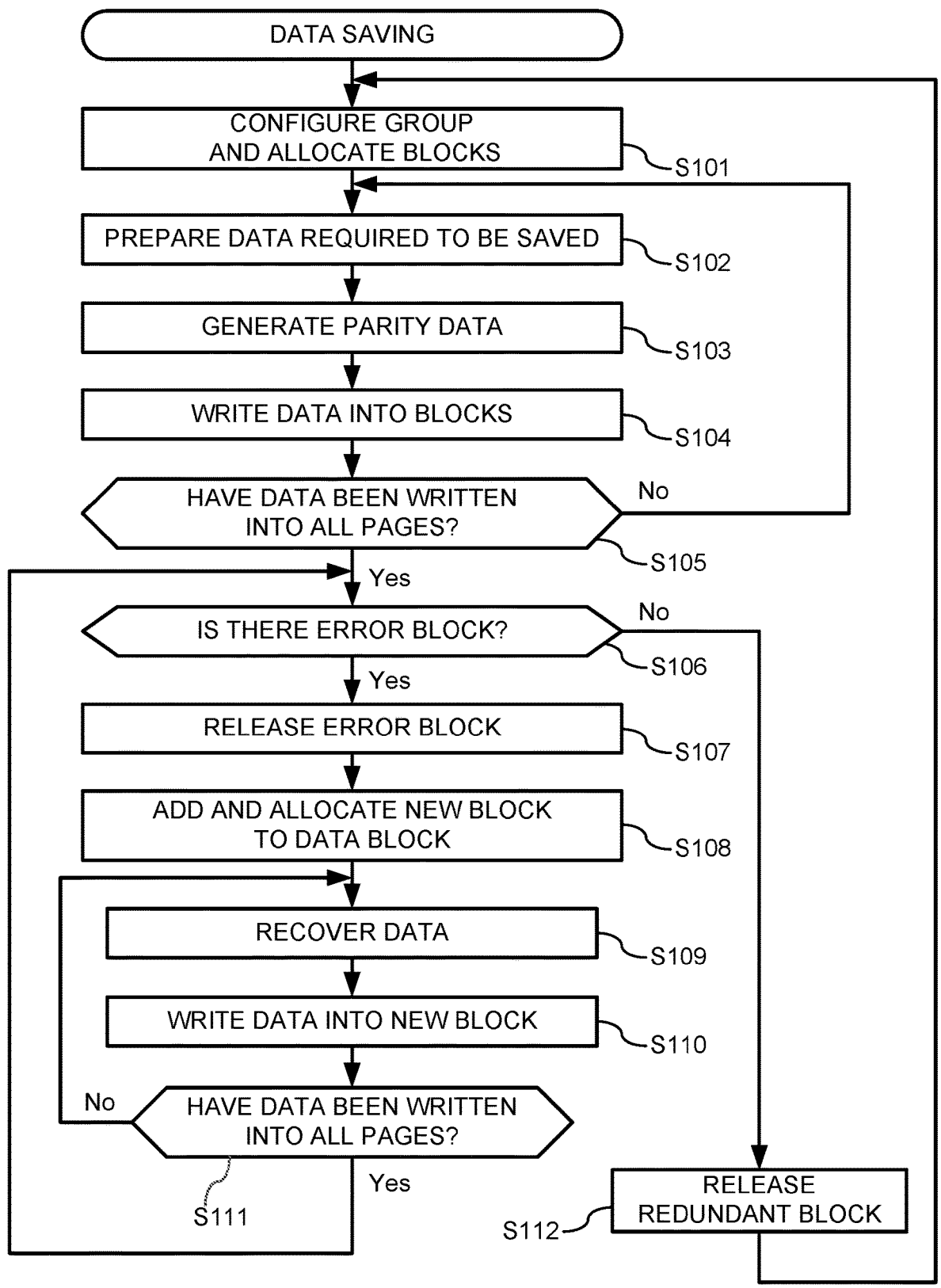
FIG. 9 is a flowchart illustrating an example of operation of data saving performed by the memory controller according to Embodiment 1 of the present disclosure.

Next, referring to FIG. 9, an example of operation of data saving performed by the memory controller 10 will be described. The operation illustrated in FIG. 9 is, for example, started after the CPU of the control circuit 12 has read and executed the control programs stored in the ROM 14 and processing required to be performed at the time of start-up has been finished. Note that actual operation of data saving is started when a write request is issued by the host system 3 (a write command is received from the host system 3).

The group manager 122 of the control circuit 12 of the memory controller 10 configures a plurality of blocks in the flash memory 2 into a group and allocates the plurality of blocks constituting the group to data blocks and a redundant block (step S101). On this occasion, the group manager 122 writes information indicating a correspondence relationship between the group and the blocks and information indicating an allocation of the data blocks and the redundant block into the group management table.

The data preparer 121 of the control circuit 12 prepares data required to be saved (step S102). As described afore, the data preparer 121 prepares data required to be saved in respective blocks in units of a page.

The redundant data generator 123 of the control circuit 12 calculates parity across pieces of data of a page unit that were prepared in step S102 and thereby generates parity data that are redundant data (step S103).

The writer 124 of the control circuit 12 writes data into pages in the respective blocks in the group by writing the data that were prepared in units of a page in step S102 into pages in the respective data blocks and writing the parity data that were generated in step S103 into a page in the redundant block (step S104).

The control circuit 12 repeats the operations in steps S102 to S104 while data have not been written into all the pages in the respective blocks (step S105: No).

When data have been written into all the pages in the respective blocks (step S105: Yes), the read checker 125 of the control circuit 12 performs read check with respect to data blocks into which data were written in step S104 and determines whether or not there is an error block in the data blocks (step S106).

When there is an error block (step S106: Yes), the group manager 122 releases the error block from the group (step S107).

The group manager 122 adds a new block to the group and allocates the block to a data block (step S108).

Note that, in steps S107 and S108, the group manager 122 updates the group management table in response to the above-described release and addition.

The recoverer 126 of the control circuit 12 recovers data required to be successfully written into the error block in units of a page, based on data that have successfully been written into the other data blocks and parity data that have successfully been written into the redundant block (step S109).

The writer 124, with respect to data that are successfully written among data that have been written into the respective pages in the error block, writes the original data and, with respect to data that are not successfully written thereamong, writes data that were recovered in step S109 into a corresponding page in the new block that was added to the group and allocated to a data block in step S108 (step S110).

The control circuit 12 repeats the operations in steps S109 and S110 while data have not been written into all the pages in the new block (step S111: No).

When data have been written into all the pages in the new block (step S111: Yes), the process returns to step S106 and the read checker 125 read-checks the new block into which data were written in step S110 and determines whether or not there is an error block (in other words, determines whether or not the new block is an error block).

When there is no error block (step S106: No), the group manager 122 releases the redundant block from the group (step S112). The control circuit 12 repeats the operations in step S101 and thereafter.

Note that the above description was made on the assumption that there do not exist two or more pages into which data are not successfully written among the pages used in combination with one another. Since, when there exist two or more pages into which data are not successfully written among the pages used in combination with one another, data cannot be recovered, the control circuit 12 informs the host system 3 of, for example, information indicating that a fatal error has occurred.

The flash memory system 1 according to Embodiment 1 has been described above. According to the flash memory system 1 according to Embodiment 1, a plurality of blocks in the flash memory are configured into a group, the plurality of blocks constituting the group are allocated to data blocks and a redundant block, and, when data are written into pages in the data blocks, parity data (redundant data) are also written into a page in the redundant block. As such, since it is possible to perform error correction using parity data (redundant data) in units of a page, it is possible to achieve high error correction capability. Further, when data have been able to be successfully written, release of the redundant block from the group enables a free space of the flash memory 2 to be reserved. Therefore, the flash memory system 1 according to Embodiment 1 enables high error correction capability to be achieved with high capacity efficiency.

Note that, although, in the above description, parity data (redundant data) were generated in units of a page and data recovery was performed using the parity data (redundant data) in units of a page, the generation of parity data (redundant data) and the data recovery may be performed in units of a data size at which error correction using an error-correcting code is performed. Note that generation of an error-correcting code and error correction using the error-correcting code may be performed in units of 512 bytes (1 sector), 1024 bytes (2 sectors), 2048 bytes (4 sectors), or the like. For example, when, in a flash memory in which eight sectors of data are written into a page, the generation of an error-correcting code and the error correction using the error-correcting code are performed in units of two sectors, the generation of parity data (redundant data) and the data recovery are also performed in units of two sectors. In other words, the generation of parity data (redundant data) and the data recovery are performed with a data size at which data to be written into each page in a data block are quartered.

Variation of Embodiment 1

Although, in Embodiment 1, it was assumed that three data blocks were allocated per group, the number of data blocks to be allocated per group may be any number of two or more. Parity data is generated by calculating parity across pieces of data required to be written into the respective data blocks without depending on the number of data blocks allocated per group.

Embodiment 2

In the flash memory system 1 according to Embodiment 1, it was assumed that a redundant block was allocated per group. On the other hand, a flash memory system 1 according to Embodiment 2, which will be described below, differs from the flash memory system 1 of Embodiment 1 in that two redundant blocks are allocated per group. The flash memory system 1 according to Embodiment 2 is suitable for a case where a flash memory 2 having characteristics that errors are highly likely to occur to the extent that error correction capability of only one redundant block is insufficient to cope with errors occurring at the time of data writing is controlled.

A configuration of the flash memory system 1 according to Embodiment 2 is similar to those illustrated in FIGS. 1 and 7, and a detailed description thereof will thus be omitted. Since operation of the flash memory system 1 is also similar to that in Embodiment 1, a description thereof will be omitted. In the following description, an outline of differences between Embodiment 2 and Embodiment 1 will be described.

Figure 10:
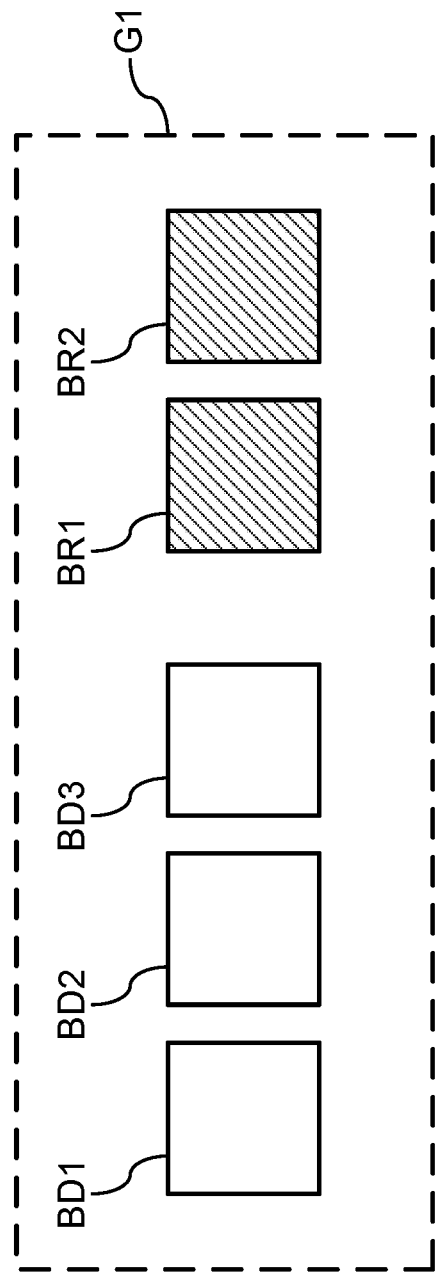
FIG. 10 is a diagram illustrating an example of a group configured by a memory controller according to Embodiment 2 of the present disclosure.

As illustrated in FIG. 10, a group manager 122 allocates three data blocks and two redundant blocks in a group. In the example illustrated in FIG. 10, three blocks among the respective blocks in a group G1 are allocated to data blocks BD1, BD2, and BD3, and the other two blocks are allocated to redundant blocks BR1 and BR2.

Figure 11:
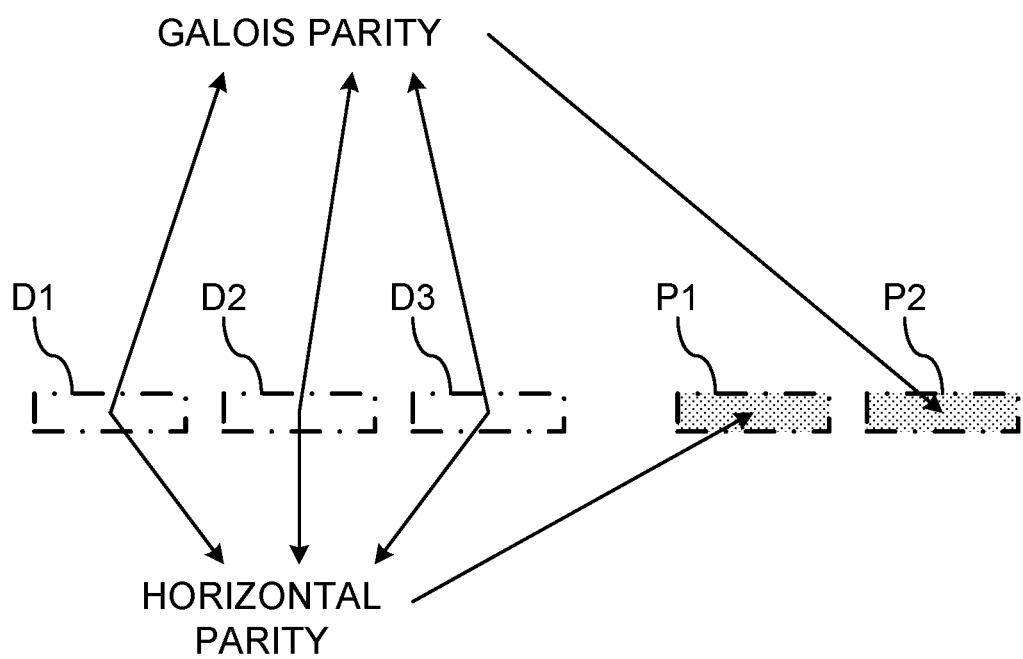
FIG. 11 is a diagram illustrating an outline of parity data generation performed by the memory controller according to Embodiment 2 of the present disclosure.

As illustrated in FIG. 11, a redundant data generator 123 generates two types of parity data by calculating two types of parity across pieces of data required to be written into the respective data blocks. In the example illustrated in FIG. 11, the redundant data generator 123 generates parity data P1 and P2 by calculating horizontal parity and Galois parity across data D1, D2, and D3 required to be written into the data blocks BD1, BD2, and BD3. The horizontal parity is calculated by means of exclusive ORs across respective pieces of data, as described in Embodiment 1. The Galois parity is calculated by performing Galois field operations in a Galois field across respective pieces of data. The parity data P1 and P2 are written into the redundant blocks BR1 and BR2, respectively, by a writer 124.

Reallocation and recovery of data when there is an error block among the data blocks after data writing are substantially the same as those in Embodiment 1. However, since, in Embodiment 2, two types of parity data are written into two redundant blocks, a recoverer 126 is able to recover data, based on data written into the other data blocks and the two types of parity data even when two data blocks among the data blocks are error blocks.

Figure 12:
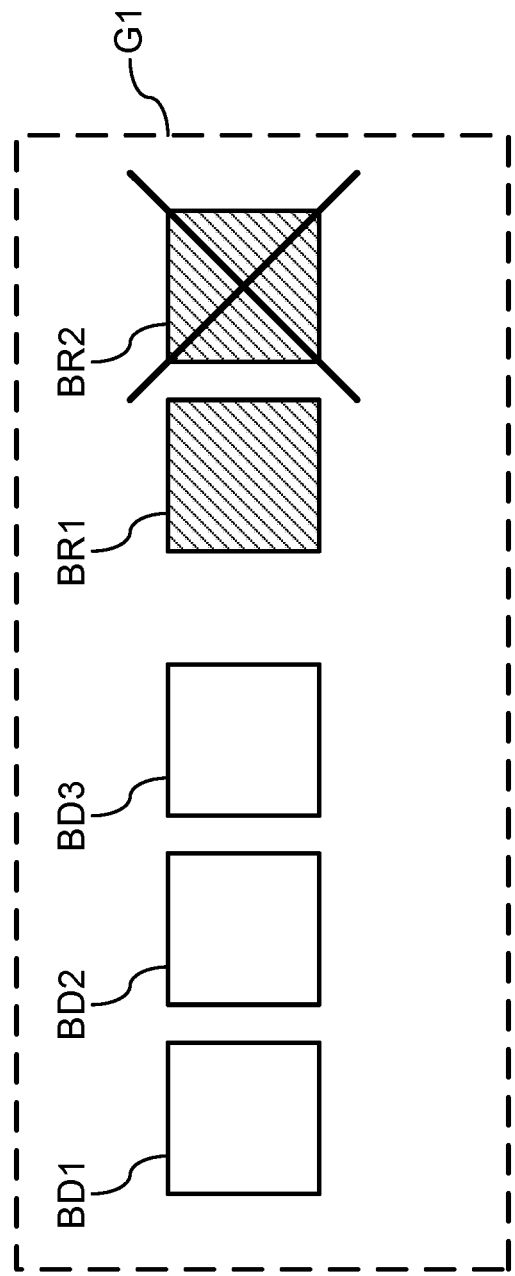
FIG. 12 is a diagram illustrating an outline of redundant block release performed by the memory controller according to Embodiment 2 of the present disclosure.

When there is no error block among the data blocks after data writing, the group manager 122 releases one of the two redundant blocks from the group, as illustrated in FIG. 12. Leaving a redundant block in the group after data writing enables data to be recovered even when a data block is determined to be an error block later. In the example illustrated in FIG. 12, the group manager 122 releases the redundant block BR2, into which the Galois parity has been written, from the group G1. Since recovery of data using the Galois parity requires a larger processing load than recovery of data using the horizontal parity, it is preferable to preferentially release a redundant block into which the Galois parity is written.

The flash memory system 1 according to Embodiment 2 has been described above. The flash memory system 1 according to Embodiment 2 enables high error correction capability to be achieved, as with Embodiment 1. Since, differing from Embodiment 1, the flash memory system 1 of Embodiment 2 leaves a redundant block in the group after data writing, it becomes possible to recover data even when a data block is determined to be an error block later. Since the flash memory system 1 of Embodiment 2 releases a redundant block after data writing, it is possible to reserve a free space of the flash memory 2. Therefore, the flash memory system 1 according to Embodiment 2 enables high error correction capability to be achieved with high capacity efficiency, as with Embodiment 1. In particular, the flash memory system 1 according to Embodiment 2 is suitable for a case where the flash memory 2 that has characteristics that errors are highly likely to occur is controlled.

Variation of Embodiment 2

Although, in Embodiment 2, it was assumed that a redundant block was left in a group after data writing, all the redundant blocks may be released from the group. This variation is suitable for, for example, a case where the flash memory 2 has characteristics that, although error correction capability of only one redundant block is insufficient to cope with errors occurring at the time of data writing, error correction capability of only an error-correcting code is sufficient to cope with an error occurring after data writing even without a redundant block.

Although, in Embodiment 2, the number of redundant blocks to be allocated was assumed to be two, the number of redundant blocks may be three or more. Although three or more types of parity data are needed in this case, three or more types of parity data can be generated because preparing a plurality of methods of Galois field operations enables a plurality of types of Galois parity to be calculated.

In Embodiment 2, as with Variation of Embodiment 1, the number of data blocks to be allocated per group may also be any number of two or more.

Embodiment 3

In Embodiments 1 and 2, redundant data were parity data generated by calculating parity across pieces of data that are written into data blocks. On the other hand, in Embodiment 3, which will be described below, redundant data are not parity data, but the same data as data to be written into a data block.

Figure 14:
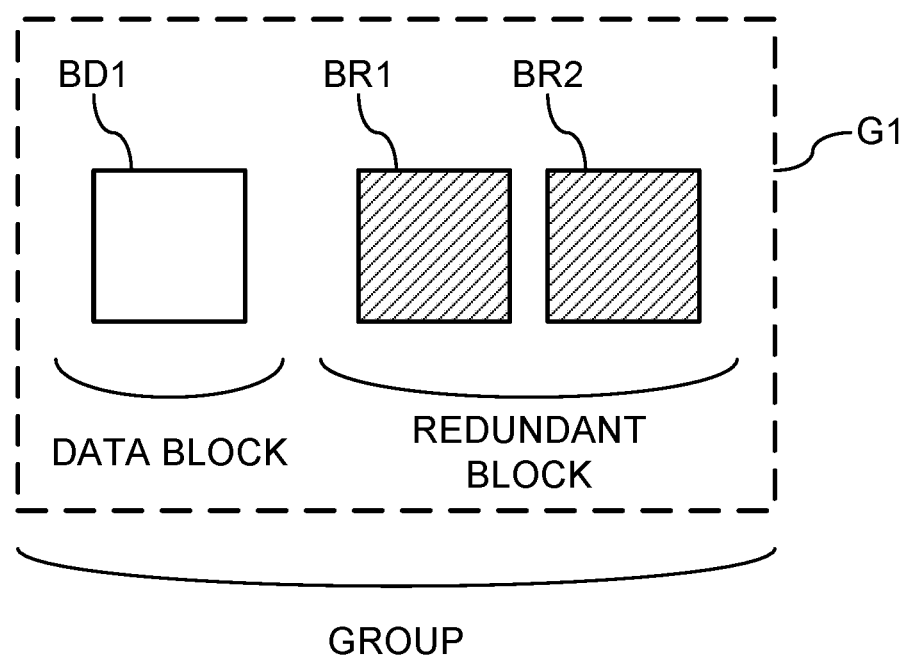
FIG. 14 is a diagram illustrating an example of a group configured by the memory controller according to Embodiment 3 of the present disclosure.

In Embodiment 3, as illustrated in FIG. 14, a data block and one or more redundant blocks are allocated in a group.

In FIG. 14, a data block BD1 and two redundant blocks BR1 and BR2 are allocated in a group G1. Although the number of redundant blocks allocated in a group may be any number of one or more, it is preferable to assign a number that enables the redundant blocks to have error correction capability sufficient to cope with an error occurring at the time of data writing. Therefore, the number of redundant blocks to be allocated is determined based on, for example, characteristics of a flash memory 2.

Figure 13:
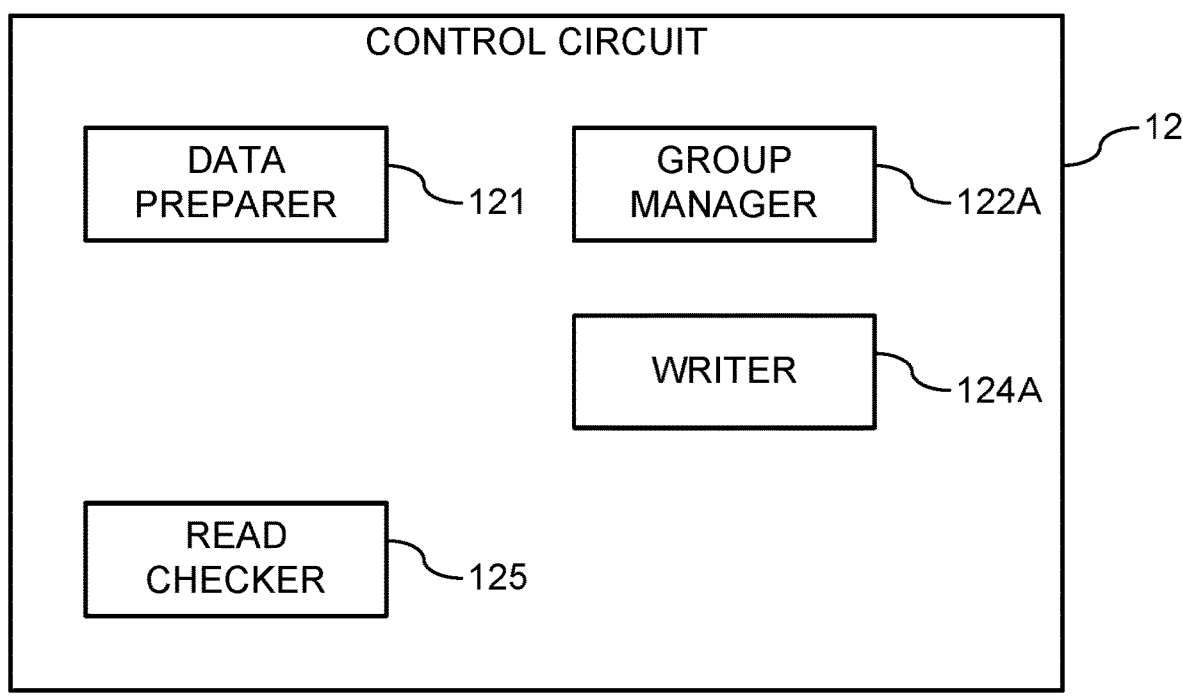
FIG. 13 is a block diagram illustrating a functional configuration of a control circuit of a memory controller according to Embodiment 3 of the present disclosure.

Although a configuration of a flash memory system 1 according to Embodiment 3 is similar to that illustrated in FIG. 1, a functional configuration of a control circuit 12 is different from that in Embodiment 1, as illustrated in FIG. 13. The control circuit 12 according to Embodiment 3 differs from that in Embodiment 1 in that the control circuit 12 does not include a redundant data generator 123 and a recoverer 126, includes a group manager 122A in place of a group manager 122, and includes a writer 124A in place of a writer 124.

Figure 15:
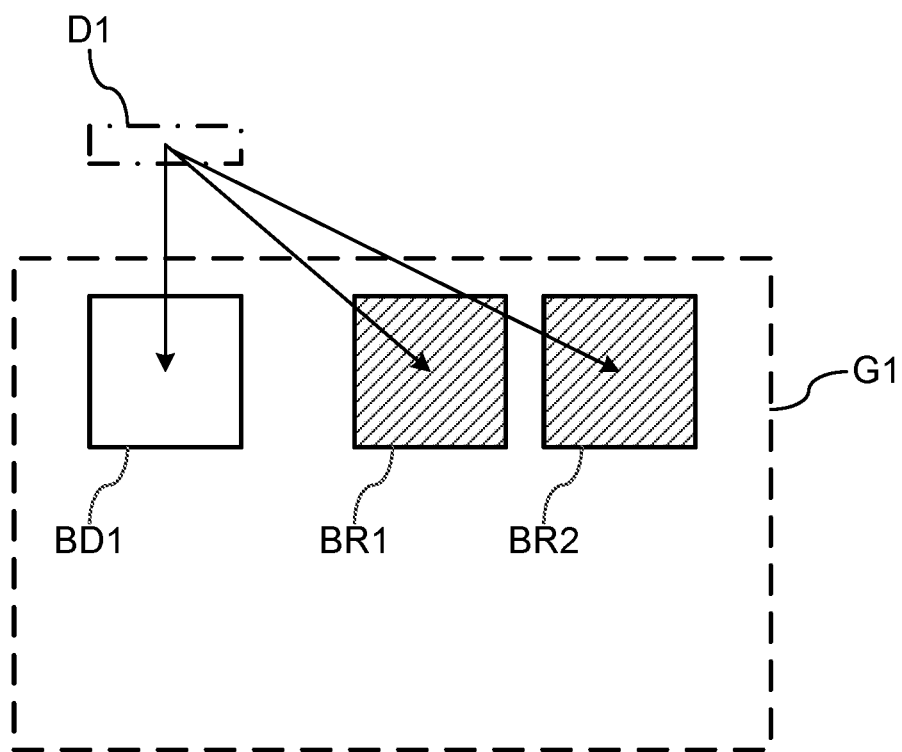
FIG. 15 is a diagram illustrating an outline of data writing performed by the memory controller according to Embodiment 3 of the present disclosure.

The writer 124A differs from the writer 124 in Embodiment 1 in that, when the writer 124A writes redundant data into a redundant block, the writer 124A writes data that a data preparer 121 has prepared into the redundant block as it is, as illustrated in FIG. 15. Therefore, the same data as data to be written into a data block are written into a redundant block as redundant data. In the example illustrated in FIG. 15, the same data D1 are written into the data block BD1 and the redundant blocks BR1 and BR2.

Figure 16:
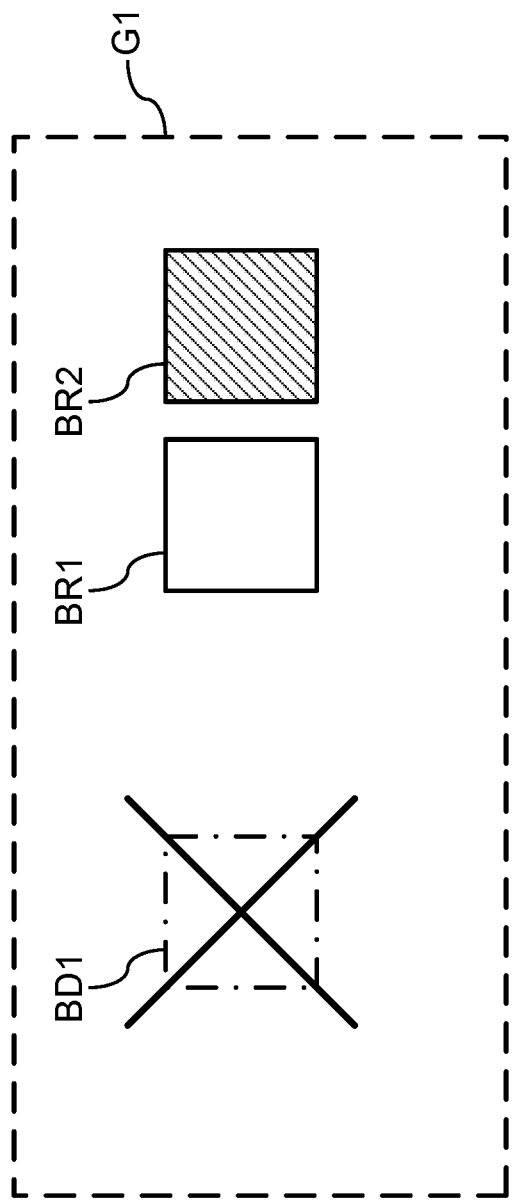
FIG. 16 is a diagram illustrating an outline of reallocation from a redundant block to a data block performed by the memory controller according to Embodiment 3 of the present disclosure.

When there is an error block among the data blocks, the group manager 122A releases the error block from the group and reallocates one of the redundant blocks, into which data have successfully been written, to the data block, as illustrated in FIG. 16. In other words, the group manager 122A differs from the group manager 122 in Embodiment 1 in that the group manager 122A, instead of adding a new block to the group and allocating the block to a data block, reallocates one of the redundant blocks to the data block. In the example illustrated in FIG. 16, the redundant block BR1 is reallocated to the data block. Since the same data as data required to be successfully written into an error block have been written into a redundant block as redundant data, it is not required to recover data and write the recovered data into a new block, differing from Embodiment 1.

Figure 17:
FIG. 17 is a diagram illustrating an example of change in data in a group management table caused by the reallocation performed by the memory controller according to Embodiment 3 of the present disclosure.

The group manager 122A updating a group management table in response to the above-described release and reallocation causes the group management table to change as illustrated in, for example, FIG. 17. As illustrated in the upper row in FIG. 17, a block a that is a data block and blocks b and f that are redundant blocks are initially allocated in a group. Since, when the block a is an error block, the group manager 122A releases the block a from the group and reallocates the block b, which is a redundant block, to the data block, the group management table changes to the one illustrated in the lower row in FIG. 17.

Figure 18:
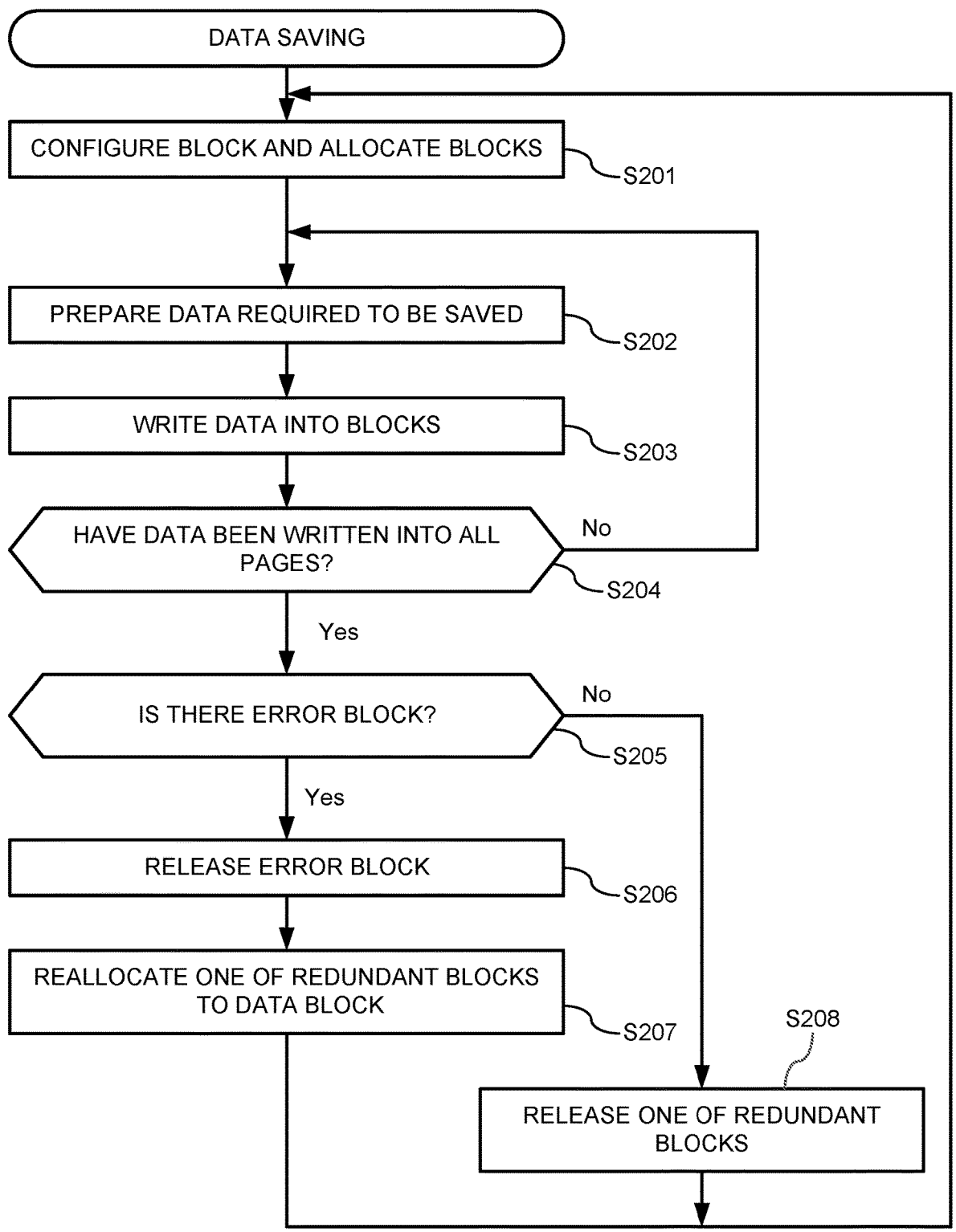
FIG. 18 is a flowchart illustrating an example of operation of data saving performed by the memory controller according to Embodiment 3 of the present disclosure.

Referring to FIG. 18, with regard to an example of data saving operation performed by a memory controller 10 according to Embodiment 3, individual operations that differ from the operations in Embodiment 1 illustrated in FIG. 9 will be described.

Since, among the operations in the respective steps illustrated in FIG. 18, the operations in steps S201, S202, S204, S205, and S206 are the same as the operations in steps S101, S102, S105, S106, and S107 illustrated in FIG. 9, descriptions thereof will be omitted.

In step S203, the writer 124A writes data that were prepared in step S201 into a data block and redundant blocks in units of a page. The operation in step S203 differs from the operation in step S104 illustrated in FIG. 9 in that the same data are written.

In step S207, the group manager 122A reallocates one of the redundant blocks to the data block. The control circuit 12 repeats the operations in step S201 and thereafter.

When there is no error block (step S205: No), the group manager 122A releases one of the redundant blocks from the group in step S208. The control circuit 12 repeats the operations in step S201 and thereafter.

Because of the operations in steps S207 and S208, blocks to be finally allocated in a group are a data block and a redundant block in both a case where there is an error block (step S205: Yes) and a case where there is no error block (step S205: No).

The flash memory system 1 according to Embodiment 3 has been described above. The flash memory system 1 according to Embodiment 3 enables high error correction capability to be achieved, as with Embodiment 1. Since the flash memory system 1 of Embodiment 3 releases a redundant block after data writing, it is possible to reserve a free space of the flash memory 2. Therefore, the flash memory system 1 according to Embodiment 3 enables high error correction capability to be achieved with high capacity efficiency, as with Embodiment 1.

Since, when there is an error block, the flash memory system 1 of Embodiment 3, differing from Embodiment 1, reallocates a redundant block into which the same data as data required to be successfully written into the error block are written to the data block, it becomes unnecessary to write data again. Since, differing from Embodiment 1, it is not necessary to calculate parity, a calculation load is low.

Variation of Embodiment 3

Although, in Embodiment 3, it was assumed that a redundant block was released after data had successfully been written, two or more redundant blocks may be released. For example, when, as with Embodiment 3, a data block and two redundant blocks are allocated in a group, all the redundant blocks may be released. This variation is suitable for, for example, a case where the flash memory 2 has characteristics that, although error correction capability of a redundant block is insufficient to cope with an error occurring at the time of data writing, error correction capability of only an error-correcting code is sufficient to cope with an error occurring after data writing even without a redundant block.

(Other Variations)

Although, in Embodiments 1 and 2, parity data were set as redundant data, the same data as data to be written into a data block may be set as redundant data as in Embodiment 3. On this occasion, it is configured such that a data block and one or more redundant blocks are allocated in a group. Although, in this case, since, differing from Embodiment 3, no redundant block is reallocated to a data block, it becomes necessary to write data again at the time of data recovery, a calculation load is lower than Embodiments 1 and 2 because it is not necessary to calculate parity.

Although, in the above-described respective embodiments, the flash memory 2 was assumed to be a NAND-type flash memory, the flash memory 2 may be a NOR-type flash memory. This is because, although a NOR-type flash memory has characteristics that an error is more unlikely to occur than a NAND-type flash memory, an error occurrence rate tends to increase associated with miniaturization and increasing capacity and high error correction capability is thus expected to be provided.

In the above-described respective embodiments, it was assumed that the respective functional units of the control circuit 12 were achieved by the CPU disposed in the control circuit 12 executing control programs. However, the control circuit 12 may include an application specific integrated circuit (ASIC) in place of the CPU, and the respective functional units of the control circuit 12 may be achieved by the ASIC. Alternatively, the control circuit 12 may include both the CPU and the ASIC, and some functions of the control circuit 12 may be achieved by the ASIC. For example, since processing, such as calculation of an error-correcting code, error correction using an error-correcting code, calculation of Galois parity, and data recovery using Galois parity, are processing requiring a high load, an ASIC dedicated to such processing may be disposed in the control circuit 12 and the ASIC may execute the processing.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A memory controller comprising:
   circuitry that:
   configures a plurality of physical blocks in a flash memory into a group,
   allocates to the plurality of physical blocks constituting the group one or more data blocks and one or more redundant blocks,
   writes data required to be saved into the one or more data blocks, and
   writes redundant data based on the data required to be saved into the one or more redundant blocks belonging to the same group as the one or more data blocks,
   when all the data required to be saved is successfully written into the one or more data blocks, the circuitry releases from the group at least one redundant block of the one or more redundant blocks belonging to the same group as the one or more data blocks.

2. The memory controller according to claim 1, wherein the circuitry further:
   when there is an error block, the error block being a data block into which the data required to be saved is not successfully written, recovers data required to be successfully written into the error block, based on data successfully written into the plurality of physical blocks constituting a group to which the error block belongs,
   releases the error block from the group to which the error block belongs,
   adds a new physical block to the group,
   allocates to the new physical block a new data block, and
   writes recovered data into the new physical block.

3. The memory controller according to claim 2, wherein the circuitry allocates to two or more physical blocks the one or more data blocks,
   the redundant data is parity data generated by calculating parity across pieces of data each of which is written into one of the two or more physical blocks allocated to the one or more data blocks, and
   the circuitry recovers data required to be successfully written into the error block, based on data successfully written into the one or more data blocks and parity data successfully written into the one or more redundant blocks.

4. The memory controller according to claim 1, wherein the redundant data is same data as data to be written into the one or more data blocks, and
   when there is an error block, the error block being a data block into which the data required to be saved is not successfully written, the circuitry further releases the error block from a group to which the one or more data blocks belong and allocates a redundant block into which the same redundant data as data required to be successfully written into the error block is written to a new data block.

5. The memory controller according to claim 1, further comprising:
   a storage storing a group management table for managing the group, wherein
   the circuitry further:
   writes information indicating a correspondence relationship between the group and the plurality of physical blocks and information indicating an allocation of the one or more data blocks and an allocation of the one or more redundant blocks into the group management table, and
   referring to the group management table, identifies the one or more data blocks and the one or more redundant blocks targeted for data writing.

6. A flash memory system comprising:
   the memory controller according to claim 1; and
   the flash memory.

* * * * *